(12) United States Patent
Ohno et al.

(10) Patent No.: US 9,805,953 B2
(45) Date of Patent: Oct. 31, 2017

(54) SUBSTRATE SEPARATION APPARATUS FOR STACKED BODY

(71) Applicant: Semiconductor Energy Laboratory Co., LTD., Atsugi-shi, Kanagawa-ken (JP)

(72) Inventors: Masakatsu Ohno, Tochigi (JP); Satoru Idojiri, Tochigi (JP); Kanpei Kikuchi, Tochigi (JP); Yoshiharu Hirakata, Kanagawa (JP); Kohei Yokoyama, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/699,576

(22) Filed: Apr. 29, 2015

(65) Prior Publication Data

US 2015/0318200 A1 Nov. 5, 2015

(30) Foreign Application Priority Data

May 3, 2014 (JP) ................................. 2014-095579

(51) Int. Cl.
*B32B 38/10* (2006.01)
*H01L 21/463* (2006.01)
(Continued)

(52) U.S. Cl.
CPC ...... *H01L 21/463* (2013.01); *H01L 21/67092* (2013.01); *H01L 21/6838* (2013.01);
(Continued)

(58) Field of Classification Search
CPC . B32B 38/10; B32B 43/006; Y10T 156/1132; Y10T 156/1168;
(Continued)

(56) References Cited

U.S. PATENT DOCUMENTS 7,182,234 B2 * 2/2007 Rayssac ............... B28D 5/0011
156/718
8,367,440 B2 2/2013 Takayama et al.
(Continued)

FOREIGN PATENT DOCUMENTS

JP 2003-174153 6/2003
JP 2008-277501 A 11/2008
(Continued)

OTHER PUBLICATIONS

International Search Report (Application No. PCT/IB2015/052893) Dated Jul. 7, 2015.
(Continued)

*Primary Examiner* — Philip Tucker
*Assistant Examiner* — Nickolas Harm
(74) *Attorney, Agent, or Firm* — Nixon Peabody LLP; Jeffrey L. Costellia

(57) ABSTRACT

A wedge-shaped jig (6) is inserted into a gap between a first substrate (21) and a second substrate (22) at a corner (221) of the second substrate (22) and separation of the attached first substrate (21) and second substrate (22) starts to proceed; then, a second suction pad (53) of a second suction portion (51), which is the closest to the corner (221), moves upward. Then, first suction pads (43) of first suction portions (41a), (41b), and (41c) sequentially move upward such that one side of the second substrate (22) separates from the stacked body. Although the second substrate (22) warps as the separation of the second substrate (22) proceeds, each of the plurality of first suction pads (43) elastically deforms. Therefore, the first suction pads (43) can be prevented from being detached from the second substrate (22), and the substrate (22) can be securely separated from the stacked body.

24 Claims, 7 Drawing Sheets

(51) Int. Cl.
*H01L 21/67* (2006.01)
*H01L 21/683* (2006.01)
*B32B 43/00* (2006.01)

(52) U.S. Cl.
CPC .............. *B32B 38/10* (2013.01); *B32B 43/006* (2013.01); *Y10T 156/1132* (2015.01); *Y10T 156/1168* (2015.01); *Y10T 156/1184* (2015.01); *Y10T 156/1928* (2015.01); *Y10T 156/1944* (2015.01); *Y10T 156/1961* (2015.01); *Y10T 156/1967* (2015.01); *Y10T 156/1978* (2015.01)

(58) Field of Classification Search
CPC ......... Y10T 156/1184; Y10T 156/1928; Y10T 156/1944; Y10T 156/1961; Y10T 156/1967; Y10T 156/1978
USPC ....... 156/706, 707, 714, 717, 755, 758, 761, 156/762, 764
See application file for complete search history.

(56) References Cited

U.S. PATENT DOCUMENTS

| | | |
|---|---|---|
| 9,211,691 B2 | 12/2015 | Honda et al. |
| 2008/0132033 A1 | 6/2008 | Eguchi et al. |
| 2011/0198040 A1* | 8/2011 | Ebata .................... B65H 41/00 156/750 |
| 2014/0076500 A1 | 3/2014 | Honda et al. |
| 2015/0059986 A1 | 3/2015 | Komatsu et al. |
| 2015/0059987 A1 | 3/2015 | Kumakura et al. |
| 2015/0060933 A1 | 3/2015 | Ohno et al. |
| 2015/0075720 A1 | 3/2015 | Hirakata et al. |
| 2015/0314424 A1 | 11/2015 | Kumakura et al. |
| 2015/0314456 A1 | 11/2015 | Kumakura et al. |
| 2015/0319893 A1 | 11/2015 | Ohno et al. |

FOREIGN PATENT DOCUMENTS

| | | |
|---|---|---|
| JP | 2010-050313 | 3/2010 |
| JP | 2014-060347 A | 4/2014 |
| JP | 2014-060348 A | 4/2014 |
| JP | 2015-035561 A | 2/2015 |
| JP | 2015-035562 A | 2/2015 |
| KR | 2014-0037767 A | 3/2014 |
| TW | 201423832 | 6/2014 |

OTHER PUBLICATIONS

Written Opinion (Application No. PCT/IB2015/052893) Dated Jul. 7, 2015.

* cited by examiner

SUBSTRATE SEPARATION APPARATUS FOR STACKED BODY

TECHNICAL FIELD

The present invention relates to a substrate separation apparatus for a stacked body. More specifically, the present invention relates to a substrate separation apparatus for a stacked body, to separate one substrate from a stacked body where an element layer including a light-emitting element, a power generation element, a power storage element, a display element, a memory element, a semiconductor element, or the like is formed between a pair of substrates.

BACKGROUND ART

In recent years, research and development of light-emitting elements utilizing electroluminescence (EL) have been actively carried out. As a basic structure of the light-emitting element, a layer containing a light-emitting substance is sandwiched between a pair of electrodes. Voltage is applied to the light-emitting element to obtain light emission from the light-emitting substance. Use of a substrate having flexibility (also referred to as a flexible substrate) for a light-emitting device with the light-emitting element has been considered to make the light-emitting device flexible. As a method for manufacturing a light-emitting device using a flexible substrate, a technology in which a separation layer is formed over a substrate such as a glass substrate or a quartz substrate, a semiconductor element such as a thin film transistor is formed over the separation layer, and then, the semiconductor element is transferred to another substrate (e.g., a flexible substrate) has been developed (see Patent Document 1).

When components of a light-emitting device or the like are formed directly on a flexible substrate, the upper-limit temperature of a manufacturing process needs to be set relatively low because a material for the flexible substrate has low heat resistance. For this reason, the quality of the components of the light-emitting device might be reduced. Furthermore, in the case where alignment is required in the manufacturing process, expansion and contraction of the flexible substrate due to heating in the manufacturing process might reduce the yield. Accordingly, to reasonably perform various heating steps, alignment steps, and the like in a manufacturing process of a light-emitting device or the like using a flexible substrate, it is preferable that the steps be performed on a rigid substrate such as a glass substrate, and that the components of the light-emitting device or the like be transferred to the flexible substrate in the final stage of the manufacturing process.

In addition, depending on the kinds of light-emitting device or the like using a flexible substrate, the following manufacturing process can be used: thin components (including, for example, a light-emitting element) formed over two different rigid substrates are attached to each other, one of the rigid substrates is separated to be replaced by a flexible substrate, and the other of the rigid substrates is also separated to be replaced by a flexible substrate. In this process, the first separation step requires a technique with great difficulty for separating one rigid substrate from the pair of rigid substrates attached to each other with an extremely narrow gap. In order for this separation to be performed, a method in which a cut is formed in the separation layer with a blade, separation is induced by blow of a gas from the cut, and a rigid substrate is drawn up by suction pads such that the separation extends to the whole area of the separation layer has also been proposed (see Patent Document 2). However, in the method of pulling the substrate apart by the suction pads, force required for pulling apart is not necessarily uniform and varies as the separation proceeds. Nonetheless, with the method disclosed in Patent Document 2, it is impossible to apply delicate, adjusted force to a glass substrate to be separated.

REFERENCE

Patent Document

[Patent Document 1] Japanese Published Patent Application No. 2003-174153
[Patent Document 2] Japanese Published Patent Application No. 2010-50313

DISCLOSURE OF INVENTION

An object of one embodiment of the present invention is to provide a substrate separation apparatus for a stacked body, which enables one substrate to be securely separated from a stacked body including an element layer between a pair of substrates.

The object is achieved by the following means. That is, Invention 1 is a substrate separation apparatus for a stacked body to separate a second substrate from a stacked body including an element layer between a first substrate and the second substrate, which includes a fixing jig for fixing the first substrate, and a first suction unit and a second suction unit for sucking the second substrate. The first suction unit includes a plurality of first suction portions provided along the outer periphery of the second substrate. The first suction portions each include a plurality of first suction pads capable of touching and being attached by suction to the top surface of the second substrate. The second suction unit includes a second suction portion provided near the outer periphery of the second substrate. The second suction portion includes a second suction pad capable of touching and being attached by suction to the top surface of the second substrate. The second suction portion is configured to have higher suction power than that of the first suction portion.

Invention 2 is the substrate separation apparatus for a stacked body according to Invention 1, further including a separation starting jig for separating part of the second substrate from the first substrate such that the part serves as a separation starting position for separating the second substrate. The second suction portion is provided closer to the separation starting position than the first suction portions are. Invention 3 is the substrate separation apparatus for a stacked body according to Invention 1 or 2, in which the plurality of first suction portions are arranged both on the center of the second substrate and along the outer periphery of the second substrate. Invention 4 is the substrate separation apparatus for a stacked body according to any one of Inventions 1 to 3, further including a liquid supplying unit for supplying a liquid to the separation starting position.

Invention 5 is the substrate separation apparatus for a stacked body according to any one of Inventions 1 to 4, further including a control mechanism capable of first moving the second suction unit in a direction of separating the second substrate and then moving the first suction units in the direction of separating the second substrate.

Invention 6 is the substrate separation apparatus for a stacked body according to any one of Inventions 1 to 5, in which a suction area of the second suction portion is larger than a suction area of the first suction portion.

In the substrate separation apparatus for a stacked body of the inventions, each of the plurality of first suction portions includes the plurality of first suction pads, and the first suction pads elastically deform in accordance with the warp of the separated second substrate. Therefore, detachment of the first suction pads can be prevented and the substrate can be securely separated.

BEST MODE FOR CARRYING OUT THE INVENTION

Embodiment 1

Figure 1:
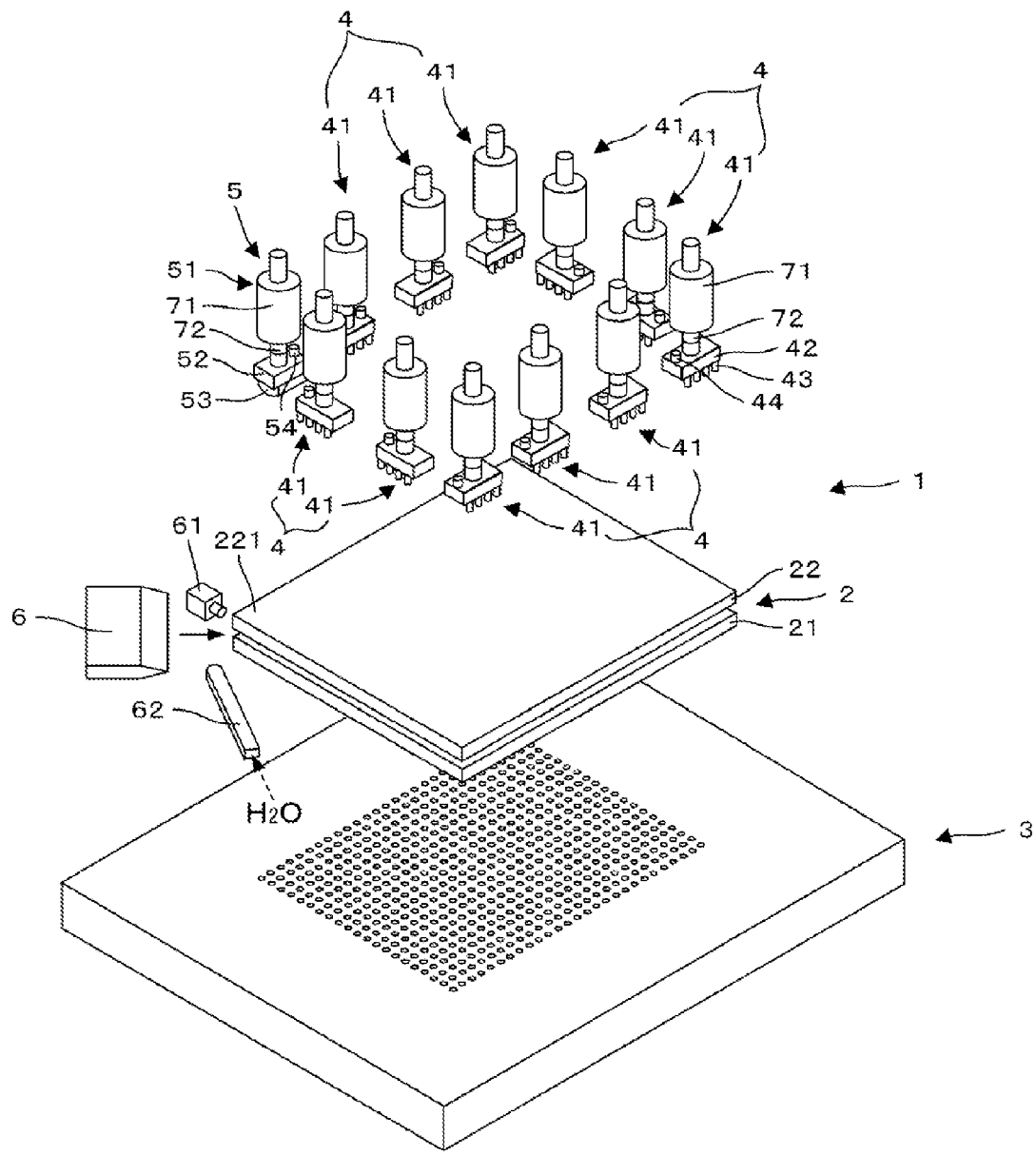
FIG. 1 is a general perspective view showing a substrate separation apparatus for a stacked body of Embodiment 1 of the present invention.

Embodiment 1 of the present invention will be hereinafter described based on the accompanying drawings. FIG. 1 is a general perspective view showing a substrate separation apparatus for a stacked body of Embodiment 1 of the present invention. A substrate separation apparatus 1 of Embodiment 1 includes a fixing stage (a fixing jig) 3 for fixing a stacked body 2 thereto, first suction units 4, a second suction unit 5, and a wedge-shaped jig (a separation starting jig) 6. Note that details such as a power mechanism with which each component is provided are not shown in FIG. 1.

The stacked body 2 corresponds to a component made up of a first substrate 21, a second substrate 22, and a thin element layer 23 (see FIGS. 6, 7, and 9) sandwiched therebetween. The first substrate 21 and the second substrate 22 can be rigid substrates such as glass substrates, for example, although not particularly limited thereto. The element layer 23 can be a stacked body including a functional element such as a semiconductor element, a display element, or a light-emitting element, and the like, for example. A separation layer that makes a separation process easier is preferably formed between the element layer 23 and the second substrate 22 or the first substrate 21. When the separation process is performed, the separation layer may remain attached to the first substrate 21, to the second substrate 22, or to the element layer 23. Furthermore, part of the separation layer or element layer 23 preferably includes a region to be a separation starting point.

As the fixing stage 3 that fixes the stacked body 2 thereto, for example, a vacuum suction stage, an electrostatic attraction stage, or the like can be used. Alternatively, the stacked body 2 may be fixed to the stage with a screwing tool, a pneumatic cylinder, or the like. As the wedge-shaped jig (the separation starting jig) 6, an edged tool can be used. The wedge-shaped jig 6 is inserted into an extremely narrow gap between the first substrate 21 and the second substrate 22 that are attached to each other to push apart the two substrates, whereby the separation starting position for separating the second substrate 22 is set. For this reason, it is preferable that the thickness of the pointed tip of the wedge-shaped jig 6 be smaller than the gap and the thickness of a plate-like portion of the wedge-shaped jig 6 be larger than the gap. In addition, a sensor 61 that senses the position where the wedge-shaped jig 6 is inserted may be provided.

It is preferable that a nozzle (a water supplying unit) 62 to which a liquid is supplied be provided near a position of the stacked body 2 where the wedge-shaped jig 6 is inserted. As the liquid, water (preferably pure water), an organic solvent, or the like can be used. A neutral, alkaline, or acidic aqueous solution, an aqueous solution in which salt is dissolved, or the like may also be used. Preferably, a liquid containing water is used. The presence of the liquid in the portion where the separation proceeds can decrease the power required for the separation. Moreover, electrostatic discharge damage to an electronic device or the like can be prevented.

The first suction units 4 each include a plurality of first suction portions 41. Along the outer periphery of the second substrate 22, which is rectangular in shape, 11 first suction portions 41 are arranged to form a rectangle. The second suction unit 5 includes a second suction portion 51. The second suction portion 51 is provided at a corner 221 near the outer periphery of the second substrate 22 that is rectangular (i.e., near the separation starting position). In the upper parts of the first suction portions 41 and the second suction portion 51, vertical movement mechanisms 71 having the same structure and movable portions 72 having the same structure are formed, whereby the vertical movement of the first suction portions 41 and the second suction portion 51 can be individually controlled. Although an example in which the number of the first suction portions 41 is 11 is shown here, one embodiment of the present invention is not limited thereto.

Figure 3A:
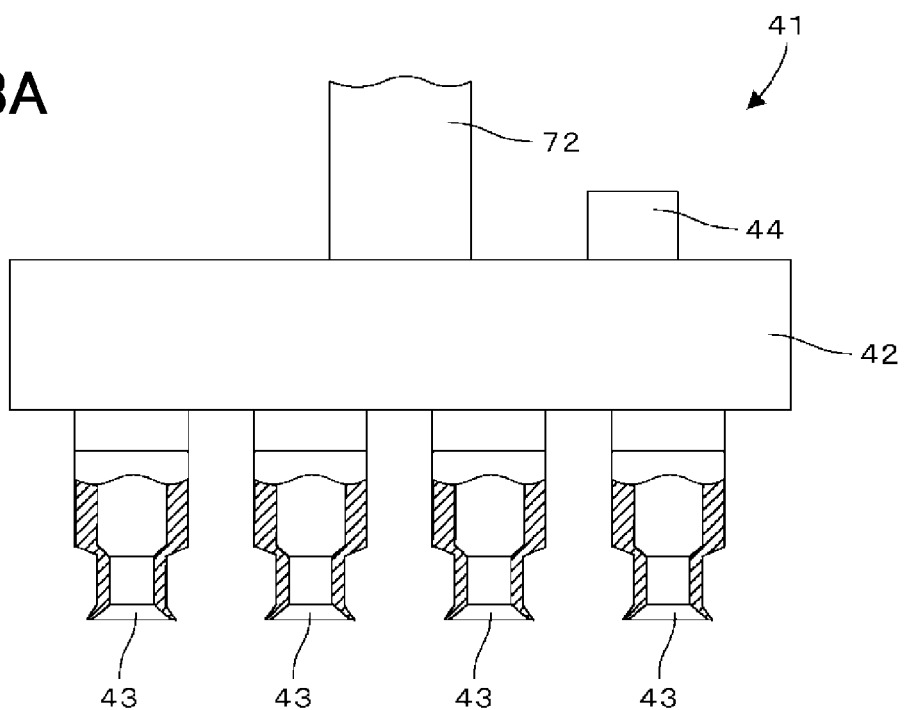
FIG. 3A is a front view of a first suction portion in FIG. 1 part of which is cut off.
Figure 3B:
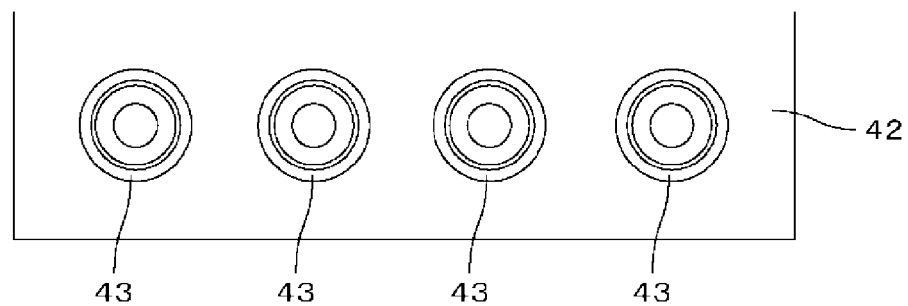
FIG. 3B is a bottom view of FIG. 3A.

As shown in FIGS. 3A and 3B, each of the first suction portions 41 includes an attachment block 42 fixed to the bottom of the movable portion 72 under the vertical movement mechanism 71, and a plurality of first suction pads 43 are attached to the under surface of the attachment block 42. As the movable portion 72, a mechanism including a universal joint or a hinge may be used. Furthermore, the movable portion 72 may be formed using an elastic material such as rubber or a spring. An inlet 44 leading to a vacuum pump or the like is formed on the top surface of the attachment block 42, and the inlet 44 is connected with the first suction pads 43. The four first suction pads 43, each of which is made of rubber and has a cylindrical shape whose under surface (suction area) is circular, are brought into contact with the top surface of the outer periphery of the second substrate 22, and concurrently vacuum-suck the second substrate 22. Although an example in which one suction portion 41 includes four first suction pads 43 is shown here, one embodiment of the present invention is not limited thereto.

Figure 4A:
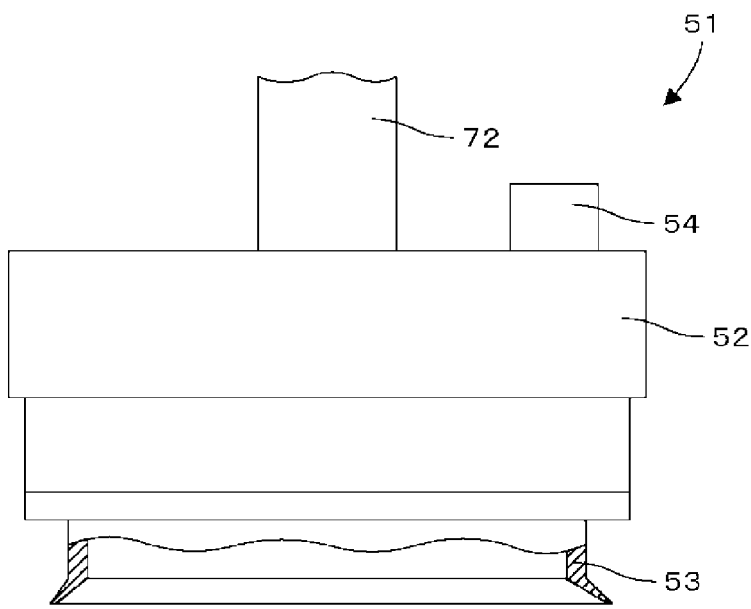
FIG. 4A is a front view of a second suction portion in FIG. 1 part of which is cut off.
Figure 4B:
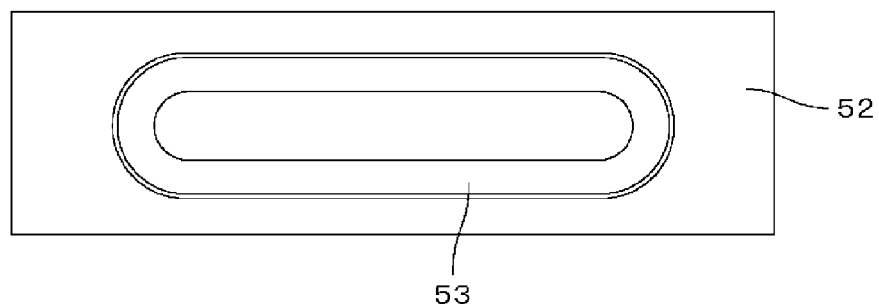
FIG. 4B is a bottom view of FIG. 4A.

As shown in FIGS. 4A and 4B, the second suction portion 51 includes an attachment block 52 fixed to the bottom of the movable portion 72 under the vertical movement mechanism 71, and a second suction pad 53, which is made of rubber and has a cylindrical shape whose under surface (suction area) has an elliptical shape, is attached to the under surface of the attachment block 52. An inlet 54 leading to a vacuum pump or the like is formed on the top surface of the attachment block 52, and the inlet 54 is connected with the second suction pad 53. The second suction pad 53 is brought into contact with the top surface near the corner 221 of the second substrate 22, and vacuum-sucks the second substrate 22. The suction area of the second suction pad 53 is larger than the total suction area of the four first suction pads 43. Therefore, the suction power of the second suction portion 51 is higher than the suction power of the first suction portion 41.

Specifically, at the beginning of the separation of the second substrate 22, high suction power to lift the second substrate 22 is required at the corner 221 near the separation starting position. Accordingly, the suction area of the second suction portion 51 is made large, and the suction power of the second suction portion 51 is higher than that of the first suction portion 41. Although the second suction portion 51 includes one suction pad in this example, a plurality of suction pads may be included to increase the suction power. Furthermore, although an example in which the suction area of the second suction pad 53 is larger than the total suction area of the four first suction pads 43 is shown here, one embodiment of the present invention is not limited thereto. For example, the degree of vacuum of the second suction portion 51 may be set higher than that of the first suction portion 41 such that the suction power of the second suction portion 51 is higher than that of the first suction portion 41.

Figure 2:
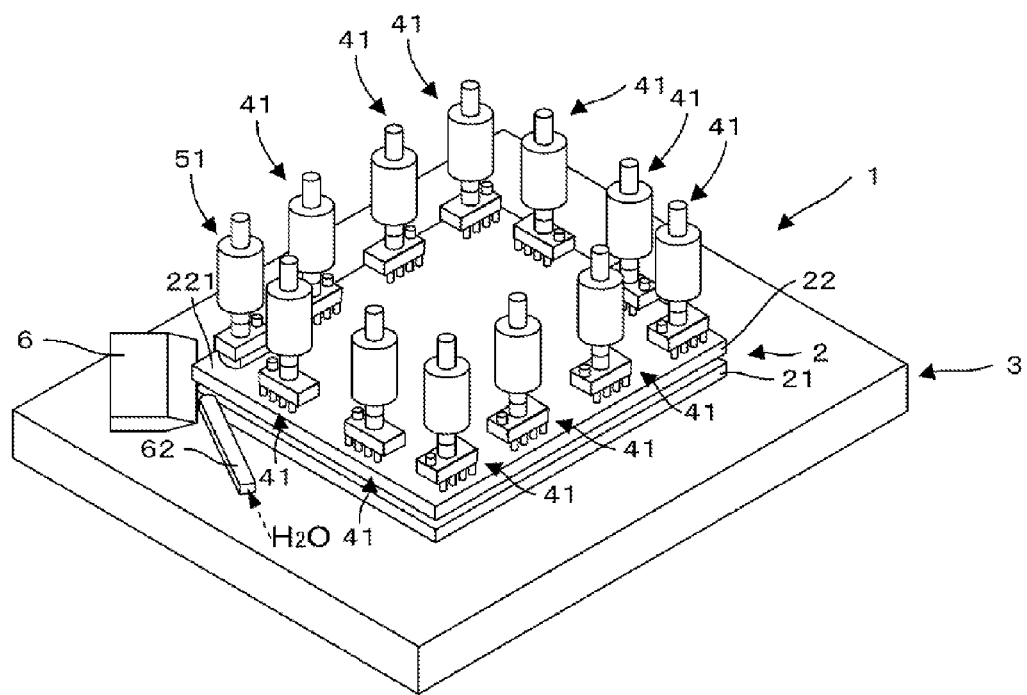
FIG. 2 is a general perspective view showing a state where the stacked body in FIG. 1 is fixed on a fixing stage.

As shown in FIG. 2, the first substrate 21 is fixed to the fixing stage 3, and all of the first suction pads 43 of the 11 first suction portions 41 and the one second suction pad 53 of the second suction portion 51 are attached to the top surface of the second substrate 22 by suction. Then, the wedge-shaped jig 6 is inserted into the gap between the first substrate 21 and the second substrate 22. The thickness of the element layer 23 sandwiched between the first substrate 21 and the second substrate 22 is extremely small, and the gap between the first substrate 21 and the second substrate 22 is extremely narrow. Assuming that the element layer 23 is a light-emitting element or a stacked body including the light-emitting element, the gap is approximately 1 µm to 15 µm. Thus, it is very difficult to fix the position of the wedge-shaped jig 6 and insert the wedge-shaped jig 6 into the gap. Therefore, it is preferable that the position of the gap be determined by the sensor 61 (e.g., an optical sensor, a displacement sensor, or a camera) shown in FIG. 1, and then the wedge-shaped jig 6 be inserted into the position.

As shown in FIG. 2, the wedge-shaped jig 6 is inserted into the gap between the first substrate 21 and the second substrate 22 at the corner 221 of the second substrate 22 to push the attached first substrate 21 and second substrate 22 apart. Then, separation starts to proceed from the region to be the separation starting point that is formed in advance. At this time, water is preferably supplied from the nozzle 62 to the portion where the separation proceeds, as described above. The separation process is shown in FIG. 5, FIG. 6, FIG. 7, and FIG. 9. Note that some of the components shown in FIG. 2 are omitted in FIG. 5, FIG. 6, and FIG. 7 for simplicity. Furthermore, arrows put on the first suction portions 41 and the second suction portion 51 schematically show the amount of upward movement of the first suction pads 43 and the second suction pad 53 or the amount of suction power to move the first suction pads 43 and the second suction pad 53 upward.

Figure 5:
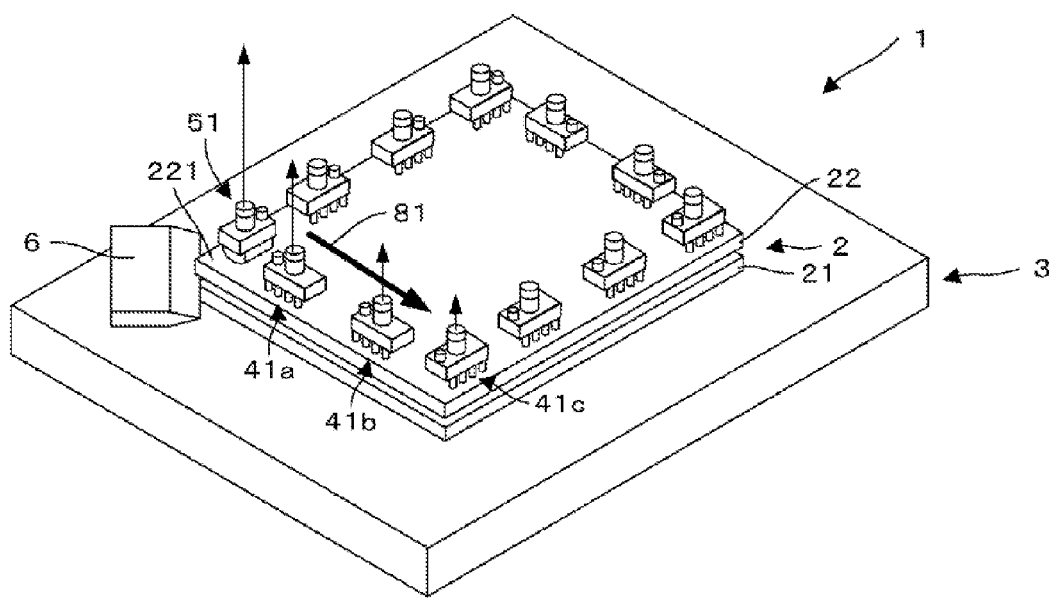
FIG. 5 is a general perspective view showing a separation process of the substrate separation apparatus for a stacked body of Embodiment 1 of the present invention.

After the wedge-shaped jig 6 is inserted into the gap at the corner 221 of the second substrate 22 and the separation of the attacked first substrate 21 and second substrate 22 starts to proceed as shown in FIG. 5, the second suction pad 53 of the second suction portion 51, which is the closest to the corner 221, slowly moves upward. Then, in order that the separation proceeds in a separation direction 81 indicated by an arrow in FIG. 5, the first suction pads 43 of first suction portions 41a, 41b, and 41c sequentially move upward such that one side of the second substrate 22 separates from the element layer.

Figure 6:
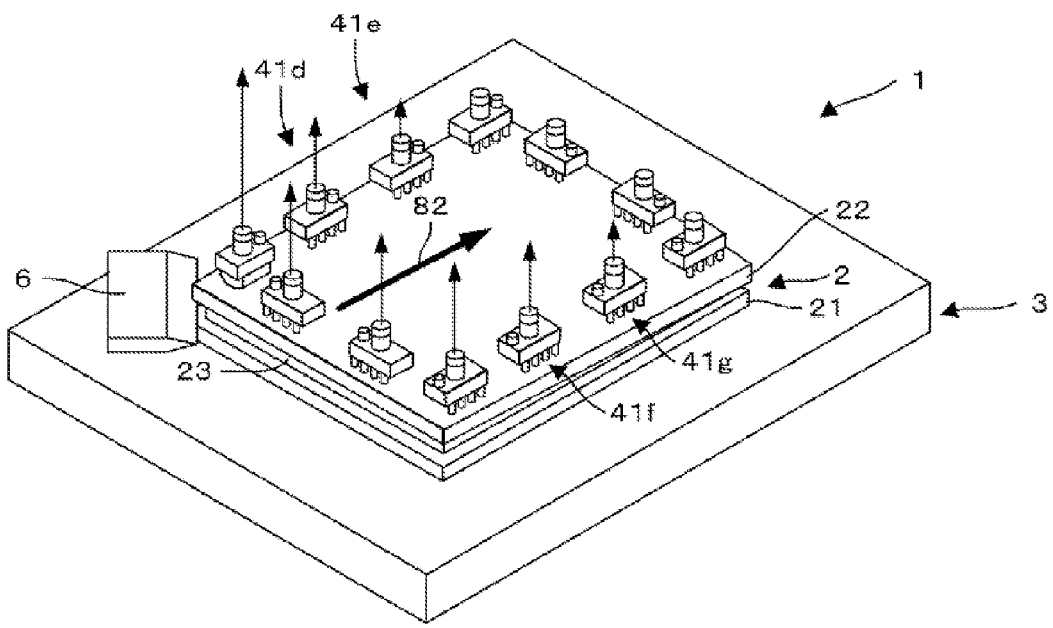
FIG. 6 is a general perspective view showing a process after the separation process shown in FIG. 5.
Figure 7:
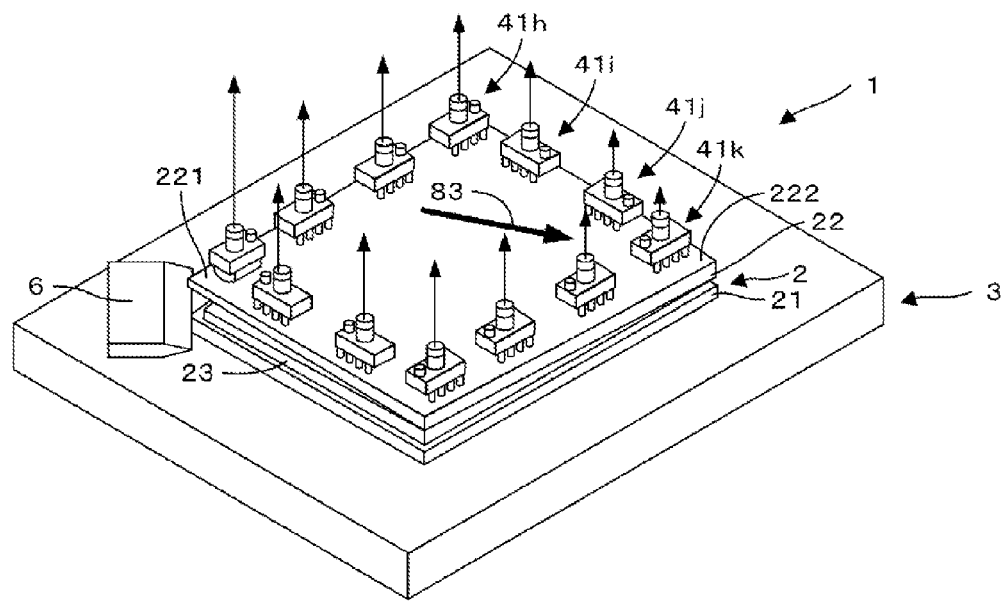
FIG. 7 is a general perspective view showing a process after the separation process shown in FIG. 6.
Figure 8:
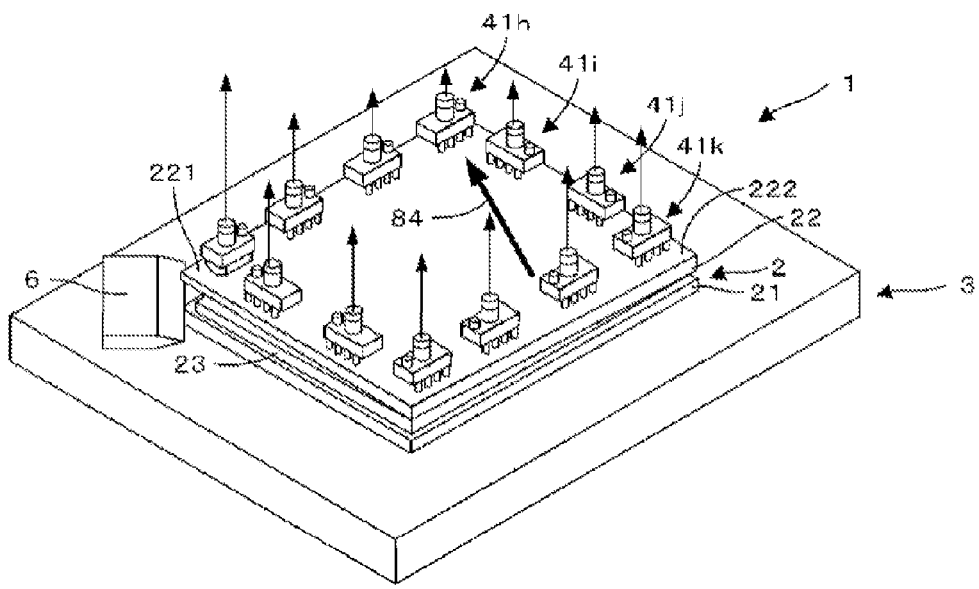
FIG. 8 is a general perspective view showing a modification example of the separation process shown in FIG. 7.

Next, in order that the separation proceeds from the separated one side of the second substrate 22 in a separation direction 82 indicated by an arrow as shown in FIG. 6, the first suction pads 43 of first suction portions 41d, 41e, 41f, and 41g sequentially move upward. Then, as shown in FIG. 7, the first suction pads 43 of first suction portions 41h, 41i, 41j, and 41k sequentially move upward to let the separation proceed in a separation direction 83 indicated by an arrow such that the separation ends at a corner position 222 diagonally opposed to the corner 221 of the second substrate 22 where the wedge-shaped jig 6 is inserted. FIG. 8 is a general perspective view showing a modification example of the separation process in FIG. 7. As shown in FIG. 8, the first suction pads 43 of the first suction portions 41k, 41j, 41i, and 41h sequentially move upward to let the separation proceed in a separation direction 84 indicated by an arrow such that the separation ends at the corner where the first suction portion 41h is provided. That is, the separation proceeds such that the separation ends at a corner of the second substrate 22 rather than on a side of the second substrate 22.

Figure 9:
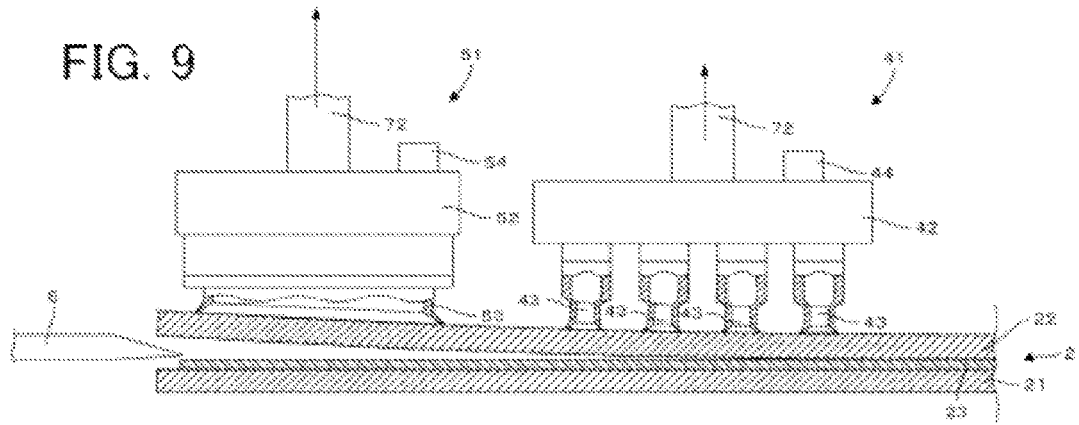
FIG. 9 is an enlarged longitudinal sectional view showing a separation process of the substrate separation apparatus for a stacked body of Embodiment 1 of the present invention.
Figure 10:
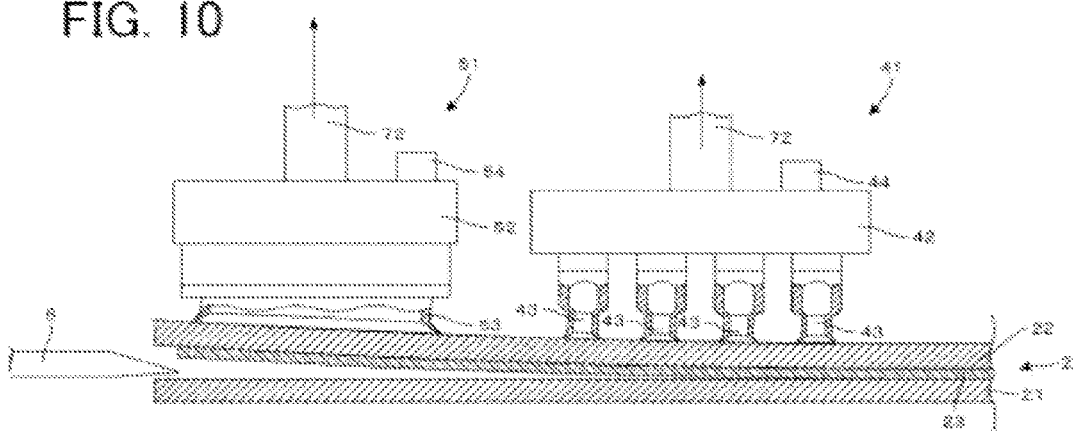
FIG. 10 is an enlarged longitudinal sectional view showing a modification example of the separation process shown in FIG. 9.

FIG. 9 is an enlarged longitudinal sectional view showing the separation process of the substrate separation apparatus 1 of Embodiment 1. As shown in FIG. 9, the first suction portion 41 includes the plurality of first suction pads 43 each of which has a small diameter. Although the second substrate 22 warps as the separation of the second substrate 22 proceeds, each of the plurality of first suction pads 43 made of rubber elastically deforms in accordance with the warp of the second substrate 22. Therefore, the first suction pads 43 can be prevented from being detached from the second substrate 22, and the substrate 22 can be securely separated from the element layer. Note that FIG. 9 shows a case where the separation occurs between the second substrate 22 and the element layer 23. In this manner, the separation can be performed with the element layer 23 in a flat state; thus, damage to the element layer 23 can be suppressed. FIG. 10 is a longitudinal sectional view showing a modification example of the separation process in FIG. 9. As shown in FIG. 10, the separation may occur between the first substrate 21 and the element layer 23. That case is preferable in that the second substrate 22 can be transferred with the element layer 23 thereon facing downward.

Embodiment 2

Figure 11:
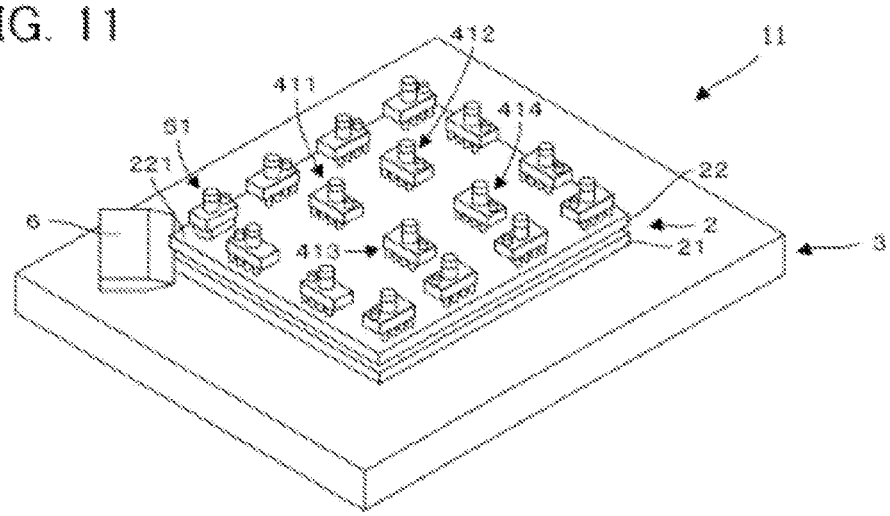
FIG. 11 shows a substrate separation apparatus for a stacked body of Embodiment 2 of the present invention.

FIG. 11 shows a substrate separation apparatus for a stacked body of Embodiment 2 of the present invention. As shown in FIG. 11, a substrate separation apparatus 11 of Embodiment 2 includes, in addition to the components included in the above-described substrate separation apparatus 1 of Embodiment 1 (see FIG. 5), four first suction portions 411, 412, 413, and 414 arranged on the center of the second substrate 22. That is, the first suction portions 41 and the second suction portion 51 are arranged only along the outer periphery of the second substrate 22 in the above-described substrate separation apparatus 1 of Embodiment 1. In contrast, the four first suction portions 411, 412, 413, and 414 are additionally arranged on the center of the second substrate 22 in the substrate separation apparatus 11 of Embodiment 2.

With such a structure, the first suction portions can be arranged over the whole area of the second substrate 22. Thus, the angle formed between the first substrate 21 and the second substrate 22 at the time of separation or the pull strength to move the first suction portions upward can be more precisely controlled. As a result, cut-off of the separated portion and detachment of the first suction pads 43 can be prevented, and the separation process of a stacked body can be performed with a high yield.

Other Embodiments

Although the embodiments of the present invention are described above, the present invention is not limited to the above embodiments. In the above embodiments, the first suction portions 41 are each configured such that the plurality of first suction pads 43 move concurrently with the use of the one vertical movement mechanism 71, for example. As another example, the plurality of first suction pads 43 may move individually with the use of individual vertical movement mechanisms 71. Such a structure is preferable because the angle formed between the first substrate 21 and the second substrate 22 at the time of separation or the pull strength to move the first suction portions upward can be more precisely controlled. Furthermore, air pressure in suction circuits for the first suction pads 43 and the second suction pad 53 may be constantly sensed such that a separation operation can be stopped when there is an abnormality in the air pressure. With such a structure, cut-off of the separated portion and detachment of the first suction pads 43 or the second suction pad 53 can be prevented, and the separation process of a stacked body can be performed with a high yield.

REFERENCE NUMERALS 1 and 11: substrate separation apparatus, 2: stacked body, 21: first substrate, 22: second substrate, 221: corner, 222: diagonally opposed corner position, 23: element layer, 3: fixing stage (fixing jig), 4: first suction unit, 41: first suction portion, 41a, 41b, 41c, 41d, 41e, and 41f: first suction portion, 41g, 41h, 41i, 41j, and 41k: first suction portion, 411, 412, 413, and 414: first suction portion, 42: attachment block, 43: first suction pad, 44: inlet, 5: second suction unit, 51: second suction portion, 52: attachment block, 53: second suction pad, 54: inlet, 6: wedge-shaped jig (separation starting jig), 61: sensor, 62: nozzle (water supplying unit), 71: vertical movement mechanism, 72: movable portion, 81, 82, 83, and 84: separation direction This application is based on Japanese Patent Application serial no. 2014-095579 filed with Japan Patent Office on May 3, 2014, the entire contents of which are hereby incorporated by reference.

The invention claimed is:

1. A substrate separation apparatus configured to separate a second substrate from a first substrate, comprising:
   a fixing jig capable of fixing the first substrate;
   a first suction unit over the fixing jig comprising:
      first suction portions each comprising:
         first suction pads capable of being attached to a top surface of the second substrate by suction; and
   a second suction unit over the fixing jig comprising:
      a second suction portion comprising:
         a second suction pad capable of being attached to the top surface of the second substrate by suction,
      wherein the substrate separation apparatus is configured so that a suction power of the second suction pad is higher than a total suction power of all of the first suction pads of each of the first suction portions.

2. The substrate separation apparatus according to claim 1, further comprising:
   a separation starting jig capable of being inserted into a gap between the first substrate and the second substrate to separate the second substrate from the first substrate,
   wherein the second suction portion is provided closer to the separation starting jig than the first suction portions are.

3. The substrate separation apparatus according to claim 2, further comprising:
   a liquid supplying unit capable of supplying a liquid to the gap.

4. The substrate separation apparatus according to claim 1, further configured so that the first suction portions are arranged on a center of the second substrate and along an outer periphery of the second substrate.

5. The substrate separation apparatus according to claim 1, further configured so that the second suction portion is arranged at a corner of the second substrate.

6. The substrate separation apparatus according to claim 1, further comprising:
   a control mechanism capable of controlling movements of the second suction unit and the first suction unit.

7. The substrate separation apparatus according to claim 1, wherein a suction area of the second suction pad of the second suction portion is larger than a total suction area of the first suction pads of the first suction portion.

8. The substrate separation apparatus according to claim 1, wherein a shape of each of the first suction pads and a shape of the second suction pad are different from each other.

9. A substrate separation apparatus configured to separate a second substrate bonded to a first substrate, comprising:
   a fixing jig capable of fixing the first substrate;
   a first suction unit over the fixing jig comprising:
      first suction portions each comprising:
         first suction pads capable of being attached to a top surface of the second substrate over the first substrate by suction; and
   a second suction unit over the fixing jig comprising:
      a second suction portion comprising:
         a second suction pad capable of being attached to the top surface of the second substrate by suction,
      wherein the first suction portions are provided along an outer periphery of the second substrate,
      wherein the second suction portion is provided near the outer periphery of the second substrate, and
      wherein the substrate separation apparatus is configured so that a suction power of the second suction pad is higher than a total suction power of all of the first suction pads of each of the first suction portions.

10. The substrate separation apparatus according to claim 9, further comprising:

a separation starting jig capable of being inserted into a gap between the first substrate and the second substrate to separate the second substrate from the first substrate, wherein the second suction portion is provided closer to the separation starting jig than the first suction portions are.

11. The substrate separation apparatus according to claim 10, further comprising:

a liquid supplying unit capable of supplying a liquid to the gap.

12. The substrate separation apparatus according to claim 9, further configured so that the first suction portions are arranged on a center of the second substrate and along an outer periphery of the second substrate.

13. The substrate separation apparatus according to claim 9, further configured so that the second suction portion is arranged at a corner of the second substrate.

14. The substrate separation apparatus according to claim 9, further comprising:

a control mechanism capable of controlling movements of the second suction unit and the first suction unit.

15. The substrate separation apparatus according to claim 9, wherein a suction area of the second suction pad of the second suction portion is larger than a total suction area of the first suction pads of the first suction portion.

16. The substrate separation apparatus according to claim 9, wherein a shape of each of the first suction pads and a shape of the second suction pad are different from each other.

17. A method for separating a second substrate from a first substrate, comprising steps of:

attaching first suction pads of each of first suction portions of a first suction unit to a top surface of the second substrate by suction;

attaching a second suction pad of a second suction portion of a second suction unit to the top surface of the second substrate by suction;

moving the second suction pad to separate the second substrate from the first substrate; and after the moving, moving the first suction pads to separate the second substrate from the first substrate, wherein a suction power of the second suction pad is higher than a total suction power of all of the first suction pads of each of the first suction portions.

18. The method according to claim 17, further comprising:

inserting a separation starting jig into a gap between the first substrate and the second substrate.

19. The method according to claim 18, further comprising:

supplying a liquid to the gap by a liquid supplying unit.

20. The method according to claim 17, wherein the first suction portions are arranged on a center of the second substrate and along an outer periphery of the second substrate.

21. The method according to claim 17, wherein the second suction portion is arranged at a corner of the second substrate.

22. The method according to claim 17, wherein movements of the second suction unit and the first suction unit are controlled by a control mechanism.

23. The method according to claim 17, wherein a suction area of the second suction pad of the second suction portion is larger than a total suction area of the first suction pads of the first suction portion.

24. The method according to claim 17, wherein a shape of each of the first suction pads and a shape of the second suction pad are different from each other.

* * * * *